United States Patent
Yoshii

(10) Patent No.: US 8,253,404 B2
(45) Date of Patent: Aug. 28, 2012

(54) CONSTANT VOLTAGE CIRCUIT

(75) Inventor: Kohji Yoshii, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 264 days.

(21) Appl. No.: 12/747,202

(22) PCT Filed: Dec. 4, 2008

(86) PCT No.: PCT/JP2008/072580
§ 371 (c)(1),
(2), (4) Date: Jun. 10, 2010

(87) PCT Pub. No.: WO2009/078345
PCT Pub. Date: Jun. 25, 2009

(65) Prior Publication Data
US 2010/0320993 A1    Dec. 23, 2010

(30) Foreign Application Priority Data

Dec. 14, 2007 (JP) .................. 2007-322880

(51) Int. Cl.
*G05F 1/40* (2006.01)
*G05F 1/56* (2006.01)

(52) U.S. Cl. ........ 323/282; 323/284; 323/285; 323/299; 323/901

(58) Field of Classification Search .................. 323/282, 323/284, 285, 299, 901
See application file for complete search history.

(56) References Cited

U.S. PATENT DOCUMENTS

| | | | |
|---|---|---|---|
| 6,208,123 B1 | 3/2001 | Sudo | |
| 6,954,056 B2 * | 10/2005 | Hoshino et al. | 323/285 |
| 7,876,080 B2 * | 1/2011 | Dwarakanath et al. | 323/284 |
| 2003/0137854 A1 | 7/2003 | Nakajima | |
| 2004/0057256 A1 * | 3/2004 | Feldtkeller | 363/21.01 |
| 2009/0167267 A1 * | 7/2009 | Dwarakanath et al. | 323/282 |

FOREIGN PATENT DOCUMENTS

| | | |
|---|---|---|
| JP | 11-224131 | 8/1999 |
| JP | 2001-100852 | 4/2001 |
| JP | 2003-216251 | 7/2003 |
| JP | 2003-271251 | 9/2003 |
| JP | 2005-327027 | 11/2005 |
| JP | 2007-215300 | 8/2007 |

OTHER PUBLICATIONS

International Search Report in PCT/JP2008/072580.

* cited by examiner

*Primary Examiner* — Bao Q Vu
(74) *Attorney, Agent, or Firm* — Cooper & Dunham LLP

(57) ABSTRACT

A disclosed constant voltage circuit is configured to become active or inactive and convert an input voltage applied to an input terminal into a predetermined constant voltage for output from an output terminal. The circuit includes an output transistor for supplying, from the input terminal to the output terminal, an output current, an error amplifier circuit unit for controlling operations of the output transistor to make a first proportional voltage, which is proportional to the output voltage from the output terminal, equal to a predetermined reference voltage, a ramp voltage generating circuit unit for generating and outputting a ramp voltage whose voltage level increases at a predetermined speed from start-up, and an amplifier circuit unit for amplifying the voltage difference between the ramp voltage and a second proportional voltage, which is proportional to the output voltage, and outputting the amplified voltage difference to a control electrode of the output transistor.

8 Claims, 5 Drawing Sheets

CONSTANT VOLTAGE CIRCUIT

TECHNICAL FIELD

The present invention generally relates to a soft start circuit of a constant voltage circuit, and particularly relates to a constant voltage circuit wherein rise time of output voltage at start-up is controlled.

BACKGROUND ART

Generally, constant voltage circuits have an output node connected to a high-capacity capacitor and therefore have high inrush currents for charging the capacitor when the constant voltage circuits are turned on. Very high or long-lasting inrush current may cause performance degradation of an output transistor and, sometimes, failure of the output transistor. To circumvent these problems, circuits for reducing inrush current at start-up have been used.

FIG. 4 is a circuit diagram of an example of a related-art constant voltage circuit having such a circuit for suppressing inrush current (see, for example, Japanese Patent Laid-Open Publication No. 2003-271251 (Patent Document 1)). FIG. 5 is a graph illustrating a relationship between an output voltage Vout and an output current of the constant voltage circuit of FIG. 4.

In the constant voltage circuit of FIG. 4, an output transistor M101 generates a constant voltage, and the generated constant voltage is output as the output voltage Vout from an output terminal 109. An output current of the output transistor M101 is detected from an output current of a PMOS transistor M102. The PMOS transistor M102 has a gate to which the same voltage as a gate voltage of the output transistor M101 is applied. The output current of the PMOS transistor M102 is input to an output current limiting circuit MA via a switching unit 113.

The output current limiting circuit MA includes a first output current limiting circuit MA1 for limiting current to a first limit current value A1 and a second output current limiting circuit MA2 for limiting current to a second limit current value A2 less than the first limit current value A1.

In response to an ON signal output from an ON/OFF control circuit 111, an error amplifier circuit 101 is activated and the output voltage Vout rises. Upon the rise of the output voltage Vout, the switching unit 113 connects the PMOS transistor M102 to the second output current limiting circuit MA2 for limiting current to the smaller limit current value A2 according to an output signal of a counter circuit 112. Accordingly, a drain current of the PMOS transistor M102 is supplied to the second output current limiting circuit MA2, whereby the output current of the output transistor M101 is limited to the second limit current value A2. This prevents excessive inrush current from flowing from the output terminal 109.

Meanwhile, in response to the ON signal output from the ON/OFF control circuit 111, the counter circuit 112 starts a counting operation. After a certain time period since starting the counting operation, the switching unit 113 connects the PMOS transistor M102 to the first output current limiting circuit MA1 for limiting current to the greater limit current value A1 according to an output signal of the counter circuit 112. Accordingly, during normal operation, the output current of the output transistor M101 is limited to the first limit current value A1 greater than the second limit current value A2.

FIG. 6 is a circuit diagram of another example of a related-art constant voltage circuit (see, for example, Japanese Patent Laid-Open Publication No. 2005-327027 (Patent Document 2)).

In the constant voltage circuit of FIG. 6, an output node of a reference voltage generating circuit 122 is connected to a series circuit of a resistor R123 and a capacitor C121, and a voltage VC at a connection point between the resistor R123 and the capacitor C121 is used as a reference voltage. Accordingly, at start-up of the constant voltage circuit, the capacitor C121 is slowly charged via the resistor 8123 with the reference voltage Vref, so that the voltage VC rises slowly. This reduces high inrush current and overshoot of output voltage.

In the case of the example of FIG. 4, however, if a load resistance connected to the output terminal 109 is small and an output current output from the output terminal 109 is greater than the second limit current value A2, the output voltage Vout rises up to only a voltage level Vc1. Then, after a certain time period, the output voltage Vout rises rapidly to the first limit current value A1 as indicated by the arrow of FIG. 5, which may cause high inrush current.

In the case of the example of FIG. 6, since the voltage VC is derived from the connection between the resistor R123 and the capacitor C121 that are connected in series between the reference voltage Vref and a ground voltage, the accuracy of the voltage VC, which is input to an inverted input node of an error amplifier circuit 121 as the reference voltage, is reduced. Further, since the capacitor C121 is charged via the resistor R123, the charging voltage of the capacitor C121 rapidly rises immediately after start-up. The output voltage Vout is proportional to the charging voltage of the capacitor C121, and hence the output voltage Vout also rapidly rises immediately after start-up, which may cause high inrush current.

DISCLOSURE OF THE INVENTION

In view of the foregoing, the present invention is directed toward providing a constant voltage circuit capable of preventing high inrush current and reducing overshoot of an output voltage.

According to an aspect of the present invention, there is provided a constant voltage circuit configured to become active or inactive according to an applied signal and to convert an input voltage applied to an input terminal into a predetermined constant voltage for output from an output terminal. The constant voltage circuit includes an output transistor configured to supply, from the input terminal to the output terminal, an output current responsive to an applied control signal; an error amplifier circuit unit configured to control operations of the output transistor to make a first proportional voltage equal to a predetermined reference voltage, the first proportional voltage being proportional to the output voltage from the output terminal; a ramp voltage generating circuit unit configured to generate and output a ramp voltage whose voltage level increases at a predetermined speed from start-up; and an amplifier circuit unit configured to amplify the voltage difference between the ramp voltage and a second proportional voltage and output the amplified voltage difference to a control electrode of the output transistor, the second proportional voltage being proportional to the output voltage from the output terminal. The amplifier circuit unit controls the operations of the output transistor to make the second proportional voltage equal to or lower than the ramp voltage.

The above-described constant voltage circuit includes the amplifier circuit unit configured to amplify the voltage difference between the ramp voltage and the second proportional voltage, which is proportional to the output voltage from the output terminal, and output the amplified voltage difference to the control electrode of the output transistor. Therefore, it is possible to set the rise time of the as desired regardless of the load connected to the output terminal and the capacity of the capacitor, which allows reduction of inrush current and overshoot of the output voltage at start-up. Furthermore, it is possible to prevent a rapid rise of the output voltage from the output terminal, and therefore it is possible to prevent malfunction of a circuit connected to the output terminal.

In the above-described constant voltage circuit, the ramp voltage may be a terminal voltage of the capacitor charged by a constant current source. Then, it is possible to obtain the ramp voltage whose voltage level increases at a predetermined speed and prevent excessively high rising speed immediately after start-up. Moreover, since there is no need to add a circuit to the circuit for generating the reference voltage used when the error amplifier circuit unit controls operations of the output transistor, it is possible to prevent a reduction in the accuracy of the reference voltage and improve the accuracy of the output voltage output from the constant voltage circuit.

BEST MODE FOR CARRYING OUT THE INVENTION

Exemplary embodiments of the present invention are described below with reference to the accompanying drawings.

First Embodiment

Figure 1:
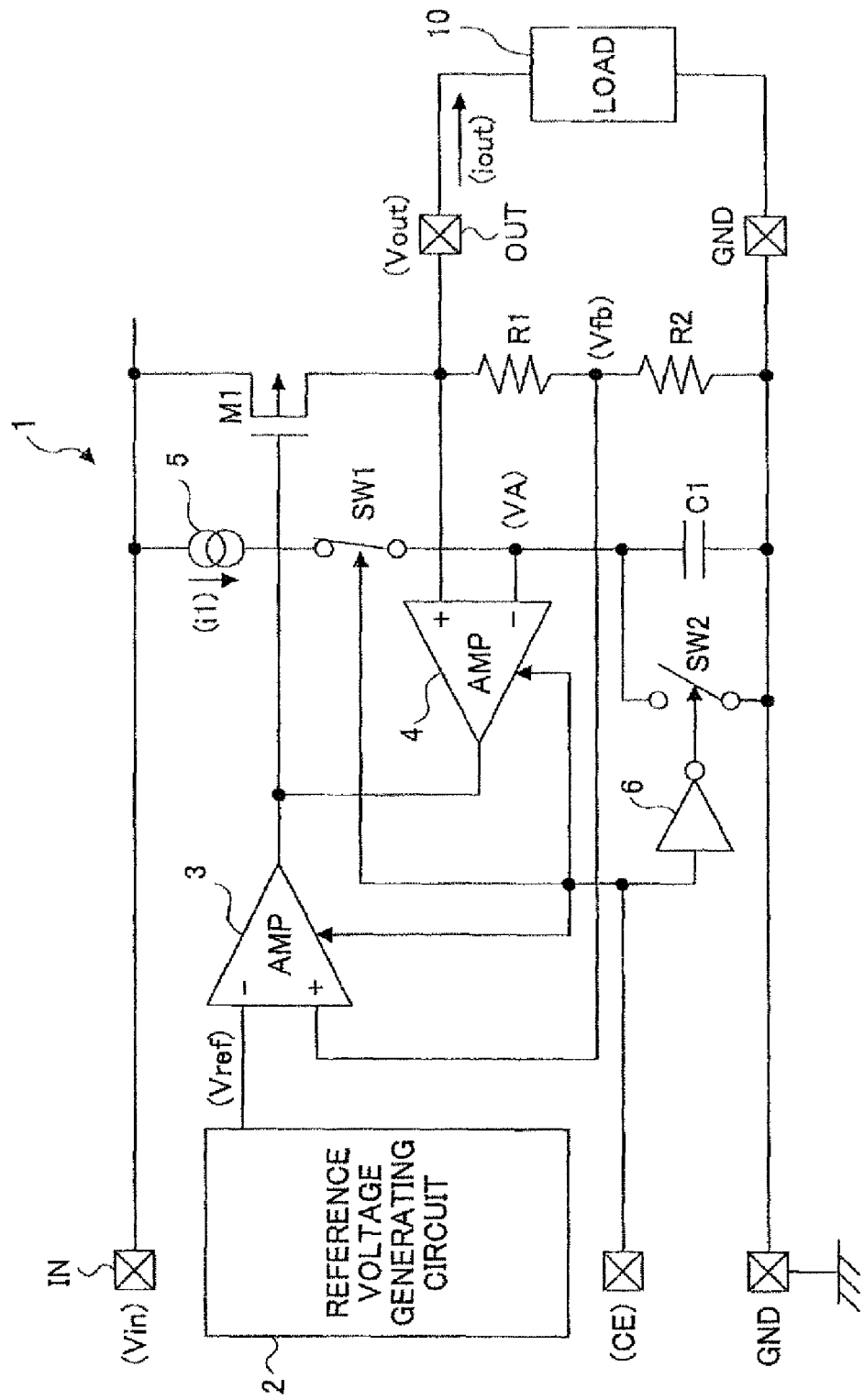
FIG. 1 is a circuit diagram of a constant voltage circuit according to a first embodiment of the present invention.

FIG. 1 is a circuit diagram of a constant voltage circuit 1 according to a first embodiment of the present invention.

In FIG. 1, the constant voltage circuit 1 forms a series regulator that generates a predetermined constant voltage from an input voltage Vin input to an input terminal IN and outputs an output voltage Vout from an output terminal OUT to a load 10. The constant voltage circuit 1 becomes active upon receiving an activation signal CE of high level from the outside, and becomes inactive upon receiving an activation signal CE of low level so that the output voltage Vout becomes 0 V.

The constant voltage circuit 1 includes a reference voltage generating circuit 2 for generating and outputting a predetermined reference voltage Vref, resistors R1 and R2 provided for output voltage detection and configured to generate and output a divided voltage Vfb by dividing the output voltage Vout, an output transistor M1 including a PMOS transistor for controlling an output current iout output from the output terminal OUT in response to a signal applied to a gate, and an error amplifier circuit 3 for controlling operations of the output transistor make the divided voltage Vfb equal to the reference voltage Vref. The constant voltage circuit 1 further includes an operational amplifier circuit 4, a constant current source 5 for generating and outputting a predetermined current i1, an inverter 6, switches SW1 and SW2, and a capacitor C1.

The error amplifier circuit 3 corresponds to an error amplifier circuit unit; the operational amplifier circuit 4 corresponds to an amplifier circuit unit; and the constant current source 5, the capacitor C1, and the switches SW1 and SW2 correspond to a ramp voltage generating circuit unit. The switch SW1 corresponds to a first switching unit; the switch SW2 corresponds to a second switching unit; and the divided voltage Vfb corresponds to a first proportional voltage. The constant voltage circuit 1 may be implemented as a single IC chip.

The output transistor M1 is connected between the input terminal IN and the output terminal OUT, and the resistors R1 and R2 are connected in series between the output terminal OUT and a ground terminal GND. The ground terminal GND is connected to a ground voltage. The divided voltage Vfb generated by dividing the output voltage Vout is output from a connection point between the resistors R1 and R2 and is input to a non-inverted input node of the error amplifier circuit 3. The error amplifier circuit 3 has an inverted input node to which the reference voltage Vref is applied and an output node connected to the gate of the output transistor M1. The operational amplifier circuit 4 has an inverted input node to which the output voltage Vout is applied and an output node connected to the gate of the output transistor M1.

The constant current source 5 and the switch SW1 are connected in series between the input terminal IN and the inverted input node of the operational amplifier circuit 4. The capacitor C1 and the switch SW2 are connected in parallel between the inverted input node of the operational amplifier circuit 4 and the ground terminal GND. The voltage applied to the inverted input node of the operational amplifier circuit 4 is hereinafter referred to as a ramp voltage VA. The switch SW1 has a control electrode to which the activation signal CE is applied, and the switch SW2 has a control electrode to which the activation signal CE is applied via the inverter 6. Accordingly, the switches SW1 and SW2 perform opposite switching operations. The error amplifier circuit 3 and the operational amplifier circuit 4 become active or inactive according to the received activation signal CE.

Figure 2:
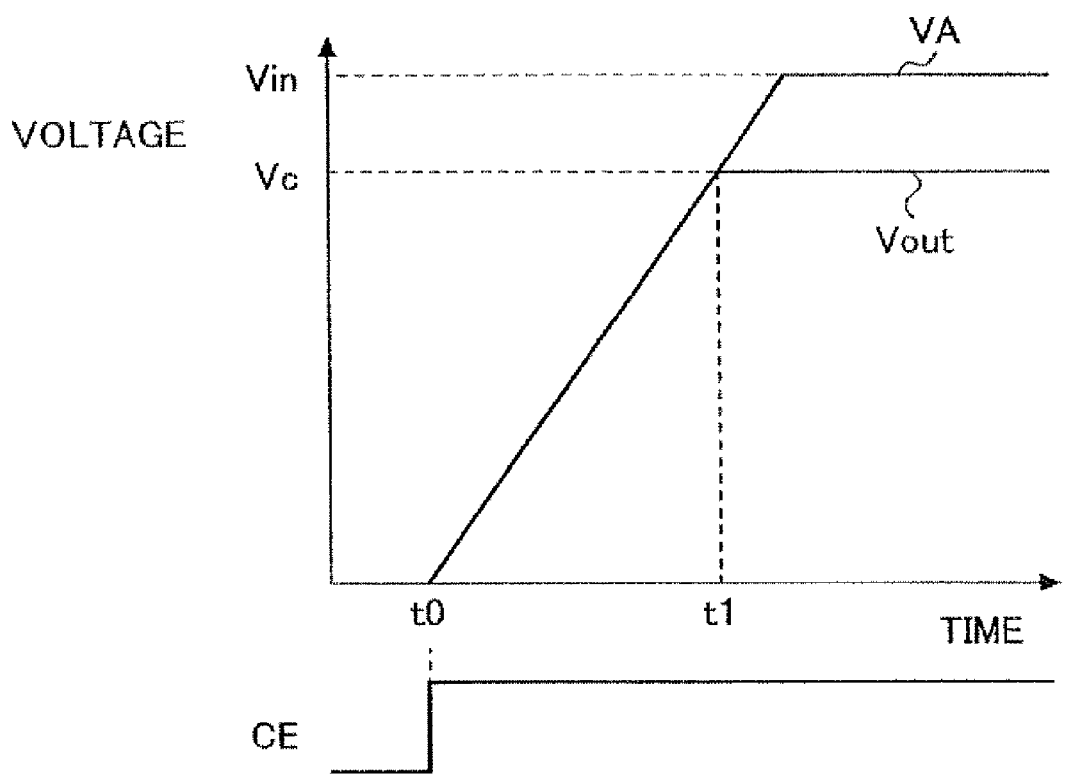
FIG. 2 is a graph for explaining how the constant voltage circuit of FIG. 1 operates.

FIG. 2 is a graph for explaining how the constant voltage circuit 1 of FIG. 1 operates. FIG. 2 shows changes in the ramp voltage VA and the output voltage Vout when the activation signal CE rises to a high level, wherein Vc represents a rated output voltage level of the constant voltage circuit 1. The following describes how the constant voltage circuit 1 of FIG. 1 operates with reference to FIG. 2.

When the activation signal CE is low, the error amplifier circuit 3 and the operational amplifier circuit 4 are in a standby state and remain inactive. The output of the operational amplifier circuit 4 has an open drain configuration of a PMOS transistor as described below, and hence can only increase a gate voltage of the output transistor M1. Therefore, the output node of the error amplifier circuit 3 is at a high level, and the output node of the operational amplifier circuit 4 is in a high impedance state. The switch SW1 is off and is in a non-conductive state, and the switch SW2 is on and is in a conductive state. That is, when the activation signal CE is low, the output voltage Vout of the constant voltage circuit 1 is 0 V, and the ramp voltage VA at a connection point between the capacitor C1 and the switch SW1 is also 0 V.

When the activation signal CE changes from low to high at time to, the error amplifier circuit 3 and the operational amplifier circuit 4 become active. At the same time, the switch SW1 is turned on to be in a conductive state, and the switch SW2 is turned off to be in a non-conductive state. Therefore, the capacitor C1 is charged with the constant current i1 from the constant current source 5, so that the ramp voltage VA rises at a constant slope. Further, since the error amplifier circuit 3 becomes active, the output voltage Vout also rises. However, when the output voltage Vout exceeds the ramp voltage VA, an output voltage of the operational amplifier circuit 4 increases, so that the gate voltage of the output transistor M1 increases. Thus, the impedance of the output transistor M1 increases, and the output voltage Vout decreases.

In this way, when the output voltage Vout exceeds the ramp voltage VA, the output voltage Vout is controlled to drop so as not to be higher than the ramp voltage VA. The rise time of the output voltage Vout at start-up of the constant voltage circuit 1 is determined by the charging time of the capacitor C1. The charging time is determined by the capacity of the capacitor C1 and the value of the current from the constant current source 5. Accordingly, it is possible to set the rise time to the minimum length by properly setting these two values. That is, the rise time may be set to make the inrush current equal to or less than an allowable current value.

Figure 3:
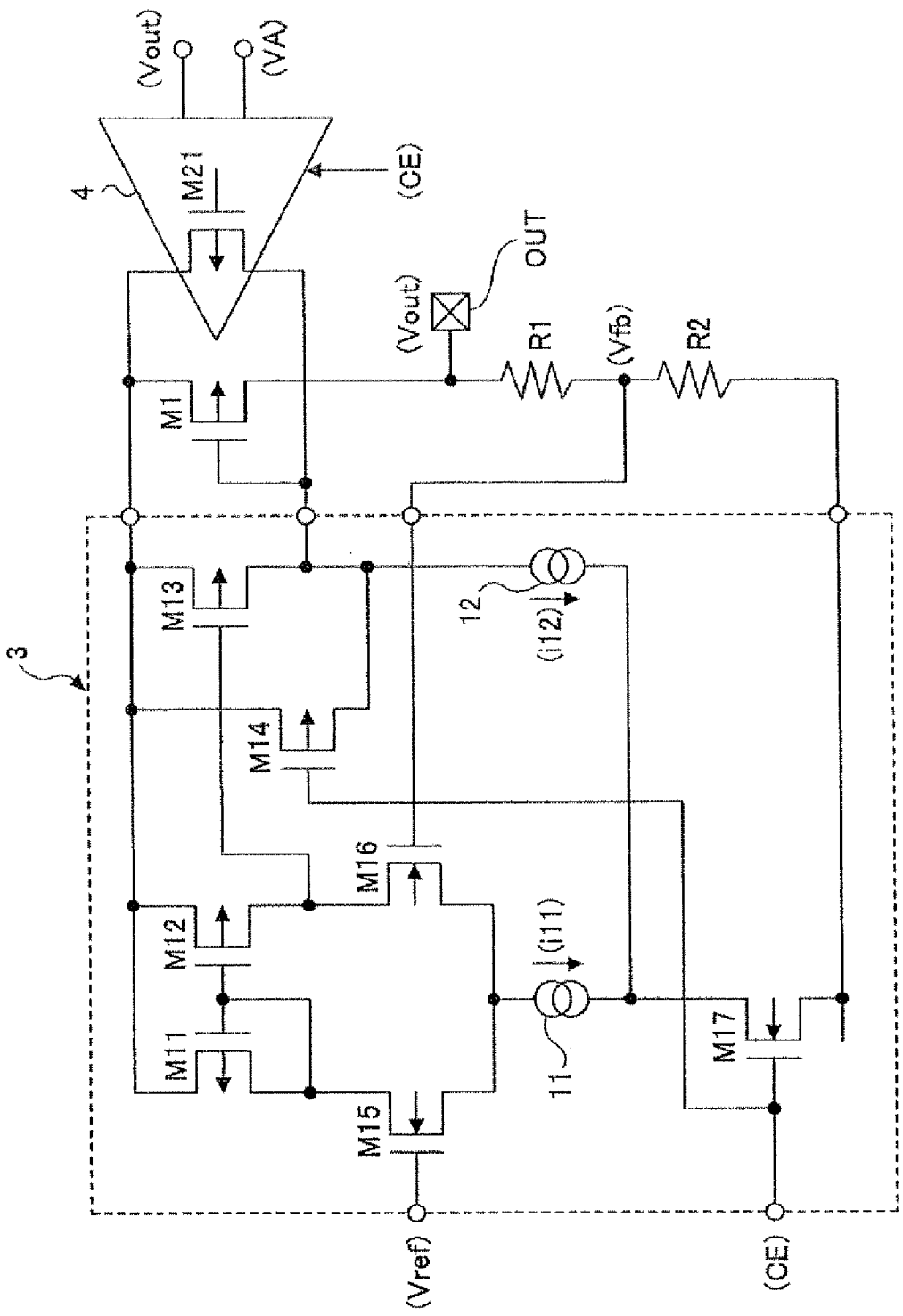
FIG. 3 is a diagram showing an example of an error amplifier circuit of the constant voltage circuit of FIG. 1 and an example how a transistor forming an output stage of an operational amplifier circuit is connected.
Figure 4:
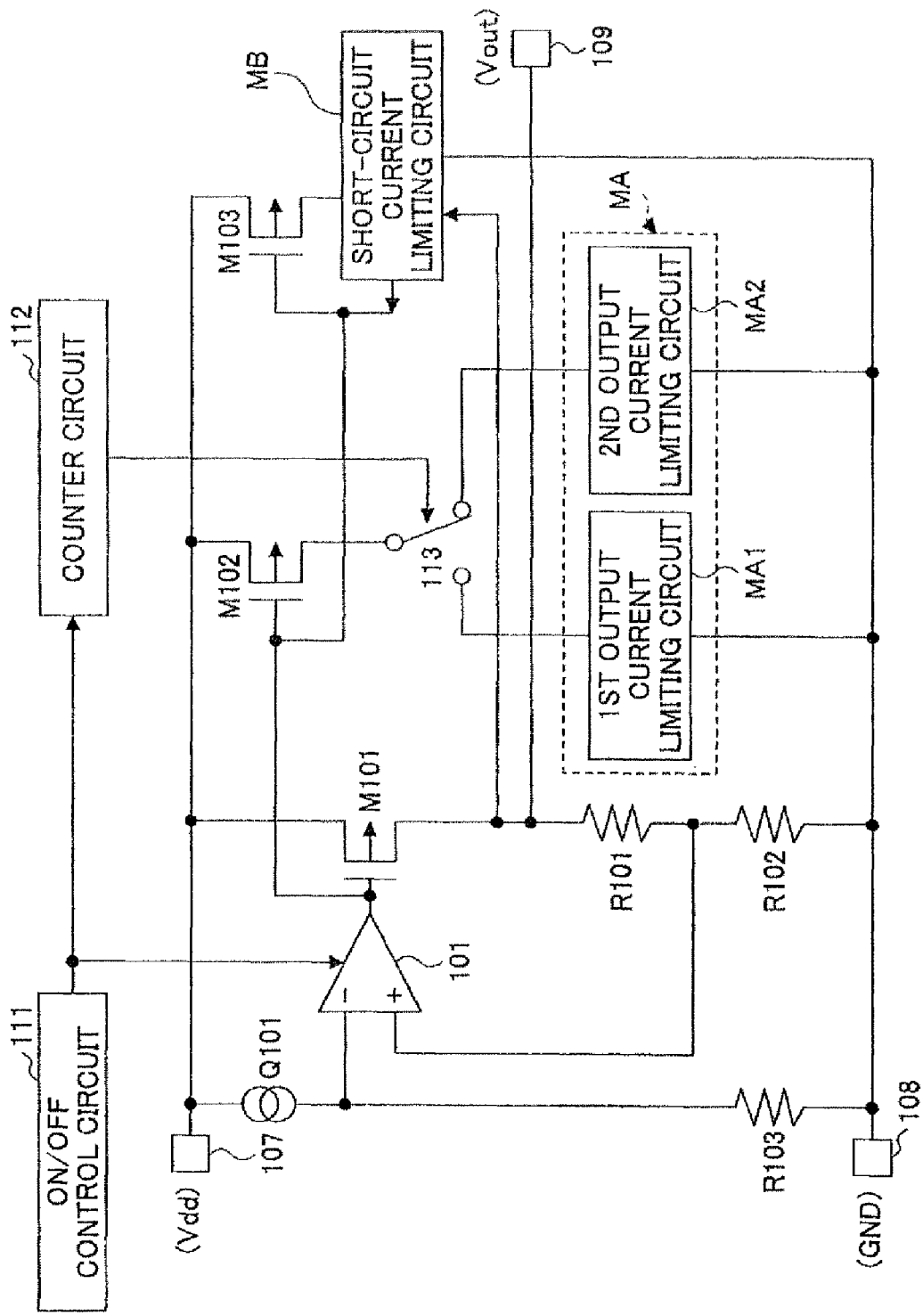
FIG. 4 is a circuit diagram of an example of a related-art constant voltage circuit.
Figure 5:
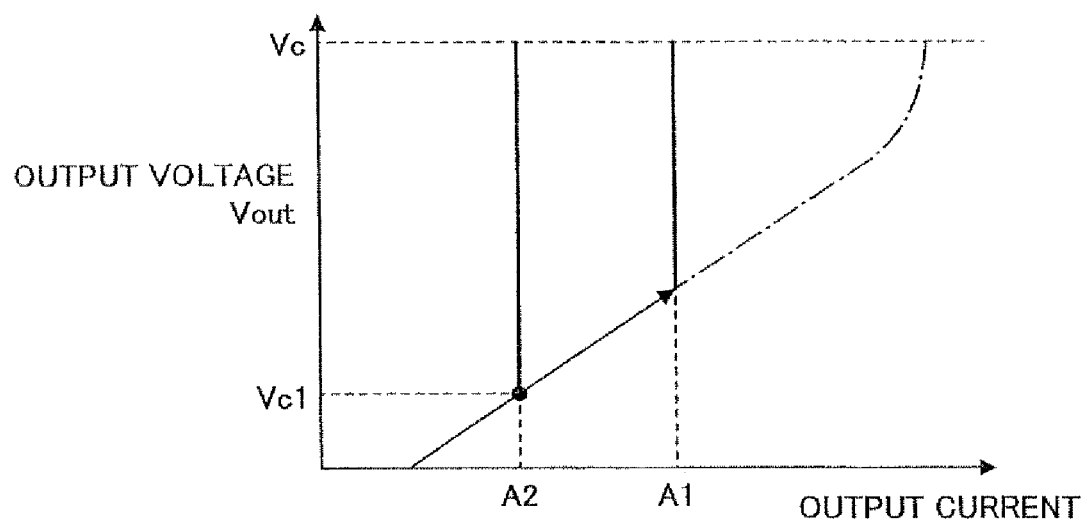
FIG. 5 is a graph for explaining how the constant voltage circuit of FIG. 4 operates.
Figure 6:
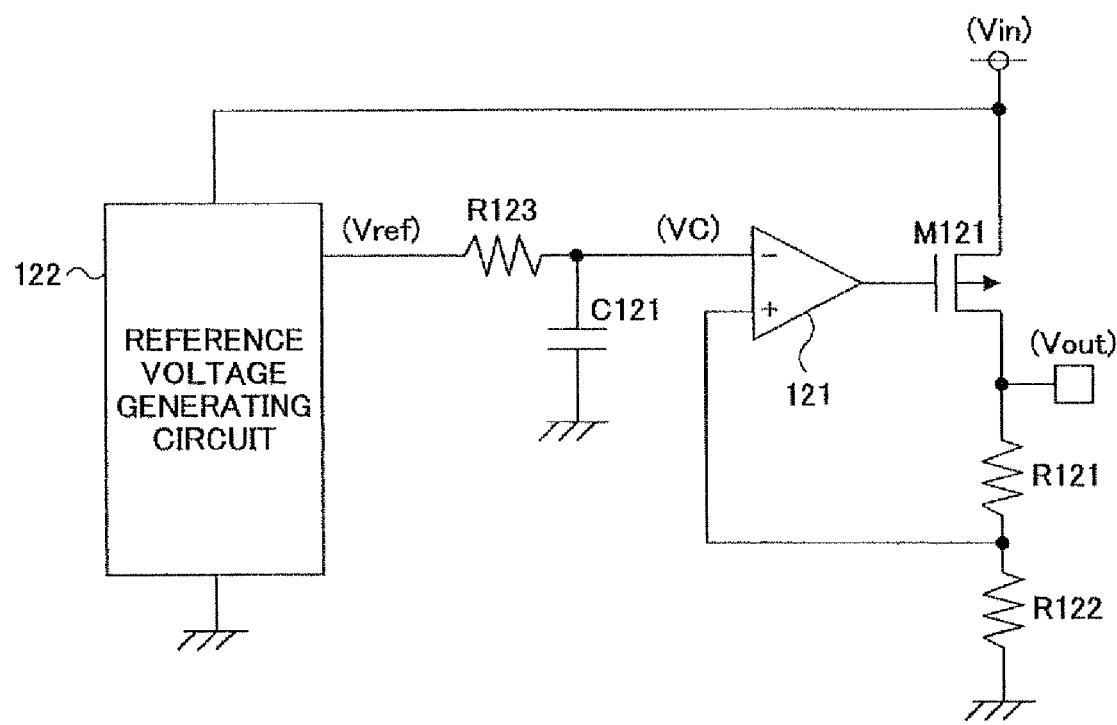
FIG. 6 is a circuit diagram of another example of a related-art constant voltage circuit.

FIG. 3 is a diagram showing an example of the error amplifier circuit 3 of the constant voltage circuit 1 of FIG. 1 and an example how a PMOS transistor M21 forming an output stage of the operational amplifier circuit 4 is connected.

In FIG. 3, the error amplifier circuit 3 includes PMOS transistors M11-M14, NMOS transistors M15-M17, and constant current sources 11 and 12 for bias. The PMOS transistors M11 and M12, the NMOS transistors M15 and M16, and the constant current source 11 form a differential amplifier circuit of a first stage, and the PMOS transistor M13 and the constant current source 12 form an amplifier circuit of the next stage.

The NMOS transistors M15 and M16 form a differential pair. The NMOS transistor 15 has a gate forming the inverted input node to which the reference voltage Vref is applied. The NMOS transistor M16 has a gate forming the non-inverted node to which the divided voltage Vfb is applied. The sources of the NMOS transistors M15 and M16 are connected to each other. The constant current source 11 and the NMOS transistor M17 are connected in series between the ground terminal GND and a connection point between the sources of the NMOS transistors M15 and M16. The NMOS transistor M17 has a gate to which the activation signal CE is applied.

The PMOS transistors M11 and M12 form a current mirror circuit as a load for the differential pair. The PMOS transistors M11 and M12 have sources connected to the input voltage Vin and gates connected to each other. A connection point between the gates is connected to a drain of the PMOS transistor M11. The PMOS transistor M13 and the constant current source 12 are connected in series between the input voltage Vin and a drain of the NMOS transistor M17. A connection point between the PMOS transistor M13 and the constant current source 12 forms the output node of the error amplifier circuit 3 connected to the gate of the output transistor M1. The PMOS transistor M13 is connected in parallel to the PMOS transistor M14. The PMOS transistor M14 has a gate to which the activation signal CE is applied. The PMOS transistor M21 forming the output stage of the operational amplifier circuit 4 is connected in parallel to the PMOS transistor M13.

The output stage of the operational amplifier circuit 4 is an open drain circuit of the PMOS transistor M21. A drain of the PMOS transistor M21 forms the output node of the operational amplifier circuit 4 and is connected to the gate of the output transistor M1. The PMOS transistor M21 is off and is in a non-conductive state when the activation signal CE is low, and becomes active when the activation signal CE becomes high.

When the active signal CE is low, the NMOS transistor M17 is off and is in a non-conductive state. Therefore, no bias current is supplied to the error amplifier circuit 3, so that the error amplifier circuit 3 remains inactive. On the other hand, the PMOS transistor M14 is turned on to be in a conductive state. Therefore, the output node of the error amplifier circuit 3 becomes high, and the gate voltage of the output transistor M1 becomes high. Then, the output transistor M1 is turned off to be in a non-conductive state, so that the output voltage Vout becomes 0 V. Here, since the PMOS transistor M21 of the operational amplifier circuit 4 is turned off to be in a non-conductive state, the operational amplifier circuit 4 does not affect an output voltage of the error amplifier circuit 3.

When the active signal CE becomes high, the NMOS transistor M17 is turned on to be in a conductive state. Therefore, a bias current is supplied to the error amplifier circuit 3, so that the error amplifier circuit 3 becomes active. On the other hand, the PMOS transistor M14 is turned off to be in a non-conductive state and therefore does not affect operations of the error amplifier circuit 3.

As can be understood from FIG. 3, the gate of the output transistor M1 is controlled by two transistors, namely, the PMOS transistor M13 of the error amplifier circuit 3 and the PMOS transistor M21 of the operational amplifier circuit 4.

When the output voltage Vout is equal to or lower than the ramp voltage VA, the operational amplifier circuit 4 increases the impedance of the PMOS transistor M21 in order to reduce the gate voltage of the output transistor M1. However, since the gate voltage of the output transistor M1 is controlled by the output voltage of the error amplifier circuit 3, the operational amplifier circuit 4 cannot reduce the gate voltage of the output transistor M1. As a result, the PMOS transistor M21 is turned off and does not affect controlling of the output voltage Vout.

When the output voltage Vout is higher than the ramp voltage VA, the operational amplifier circuit 4 reduces the impedance of the PMOS transistor M21 in order to increase the gate voltage of the output transistor M1. Therefore, the gate voltage of the output transistor M1 rises, so that the impedance of the output transistor M1 increases. Thus, the output voltage Vout is reduced. As a result, the output voltage Vout drops to the same level as the ramp voltage VA.

At start-up of the constant voltage circuit 1 (immediately after the activation signal becomes high), since the capacitor C1 is charged with the constant current i1, the ramp voltage VA rises at a constant slope. Meanwhile, the output voltage Vout of the constant voltage circuit 1 attempts to rise rapidly due to the action of the error amplifier circuit 3. However, as mentioned above, when the output voltage Vout exceeds the ramp voltage VA, the operational amplifier circuit 4 reduces the output voltage Vout. As a result, the output voltage Vout rises at the same speed as the ramp voltage VA.

According to the first embodiment, the constant voltage circuit 1 includes the operational amplifier circuit 4 to which the ramp voltage VA generated at start-up and the output voltage Vout are applied, and the operational amplifier circuit 4 controls the gate voltage of the output transistor M1. This makes it possible to set the length of the rise time of the output voltage Vout as desired. By setting the length of the rise time that reduces inrush current and overshoot at start-up, it is possible to prevent high inrush current and reduce overshoot of the output voltage.

It is also possible to cause the ramp voltage VA to rise at a constant slope as the voltage of the capacitor C1 is charged by the constant current source 5. Therefore, unlike the related-art examples, it is possible to prevent excessively high rising speed immediately after start-up. Moreover, since no additional circuit is added to the circuit for generating the reference voltage Vref, it is possible to prevent a reduction in the accuracy of the reference voltage.

In the above embodiment, the operational amplifier circuit 4 amplifies the voltage difference between the ramp voltage VA and the output voltage Vout. In an alternative embodiment, a voltage proportional to the output voltage Vout may be used in place of the output voltage Vout. For example, the divided voltage Vfb may be used. Alternatively, an additional circuit for dividing the output voltage Vout may be added so that a divided voltage generated by this voltage divider circuit may be used.

The present application is based on Japanese Priority Application No. 2007-322880 filed on Dec. 14, 2007, with the Japanese Patent Office, the entire contents of which are hereby incorporated by reference.

The invention claimed is:

1. A constant voltage circuit configured to become active or inactive according to an applied signal and to convert an input voltage applied to an input terminal into a predetermined constant voltage for output from an output terminal, the constant voltage circuit comprising:
   an output transistor configured to supply, from the input terminal to the output terminal, an output current responsive to an applied control signal;
   an error amplifier circuit unit configured to control operations of the output transistor to make a first proportional voltage equal to a predetermined reference voltage, the first proportional voltage being proportional to the output voltage from the output terminal;
   a ramp voltage generating circuit unit configured to generate and output a ramp voltage whose voltage level increases at a predetermined speed from start-up; and
   an amplifier circuit unit configured to amplify a voltage difference between the ramp voltage and a second proportional voltage and output the amplified voltage difference to a control electrode of the output transistor, the second proportional voltage being proportional to the output voltage from the output terminal;
   wherein the amplifier circuit unit controls the operations of the output transistor to make the second proportional voltage equal to or lower than the ramp voltage.

2. The constant voltage circuit as claimed in claim 1, wherein the ramp voltage generating circuit unit includes a constant current source configured to generate and output a predetermined constant current, a capacitor configured to be charged with the constant current from the constant current source, and a first switching unit configured to supply the constant current from the constant current source to the capacitor at the start-up; and
   wherein a terminal voltage of the capacitor is the ramp voltage.

3. The constant voltage circuit as claimed in claim 2, wherein the ramp voltage generating circuit unit includes a second switching unit configured to discharge the capacitor if the applied activation signal instructs inactivation; and
   wherein the first switching unit and the second switching unit perform opposite operations according to the activation signal.

4. The constant voltage circuit as claimed in claim 1, wherein the amplifier circuit unit includes an output stage having an open drain configuration.

5. The constant voltage circuit as claimed in claim 1, wherein the error amplifier circuit unit and the amplifier circuit unit are configured to become active or inactive according to the activation signal.

6. The constant voltage circuit as claimed in claim 1, wherein the second proportional voltage is the output voltage output from the output terminal.

7. The constant voltage circuit as claimed in claim 1, wherein the second proportional voltage is identical to the first reference voltage.

8. The constant voltage circuit as claimed in claim 1, wherein the output transistor, the error amplifier circuit unit, the ramp voltage generating circuit unit, and the amplifier circuit unit are integrated in a single IC chip.

* * * * *